US008692569B2

(12) United States Patent
Fossum et al.

(10) Patent No.: US 8,692,569 B2
(45) Date of Patent: *Apr. 8, 2014

(54) CIRCUIT BOARD TESTING DEVICE WITH SELF ALIGNING PLATES

(75) Inventors: Troy Fossum, Becker, MN (US); David Kariniemi, New Hope, MN (US)

(73) Assignee: Circuit Check, Inc., Maple Grove, MN (US)

( * ) Notice: Subject to any disclaimer, the term of this patent is extended or adjusted under 35 U.S.C. 154(b) by 247 days.

This patent is subject to a terminal disclaimer.

(21) Appl. No.: 13/083,857

(22) Filed: Apr. 11, 2011

(65) Prior Publication Data

US 2011/0234248 A1    Sep. 29, 2011

Related U.S. Application Data

(63) Continuation of application No. 12/571,916, filed on Oct. 1, 2009, now Pat. No. 8,004,300, and a continuation of application No. 12/033,678, filed on Feb. 19, 2008, now abandoned.

(60) Provisional application No. 60/902,334, filed on Feb. 20, 2007.

(51) Int. Cl.
*G01R 31/28* (2006.01)

(52) U.S. Cl.
USPC ............ 324/750.25; 324/750.16; 324/750.19; 324/750.22

(58) Field of Classification Search
CPC .................................................. G01R 31/2808
USPC ............................ 324/750.01–765.01, 158.1
See application file for complete search history.

(56) References Cited

U.S. PATENT DOCUMENTS

| 5,087,878 | A  | * | 2/1992 | Belmore et al. | 324/750.22 |
|---|---|---|---|---|---|
| 5,227,717 | A  |   | 7/1993 | Tsurishima et al. | |
| 5,408,189 | A  | * | 4/1995 | Swart et al. | 324/750.22 |
| 5,550,481 | A  | * | 8/1996 | Holmes et al. | 324/754.13 |
| 5,572,144 | A  |   | 11/1996 | Davidson et al. | |
| 6,037,764 | A  | * | 3/2000 | Smith et al. | 324/756.01 |
| 6,359,452 | B1 |   | 3/2002 | Mozzetta | |
| 6,377,061 | B1 | * | 4/2002 | Settle et al. | 324/756.02 |
| 6,413,113 | B2 |   | 7/2002 | Uher et al. | |
| 6,580,283 | B1 | * | 6/2003 | Carbone et al. | 324/750.19 |
| 6,900,648 | B2 |   | 5/2005 | Ou et al. | |
| 7,119,559 | B2 |   | 10/2006 | Beaucage et al. | |
| 7,129,730 | B2 |   | 10/2006 | Liu et al. | |
| 8,004,300 | B2 | * | 8/2011 | Fossum et al. | 324/756.02 |
| 2005/0017742 | A1 | * | 1/2005 | Stutzman | 324/755 |
| 2007/0152694 | A1 | * | 7/2007 | Yin et al. | 324/765 |

* cited by examiner

*Primary Examiner* — Arleen M Vazquez
*Assistant Examiner* — Adam Clarke
(74) *Attorney, Agent, or Firm* — Altera Law Group, LLC

(57) ABSTRACT

A circuit board tester and method that precisely aligns the probe plate and circuit board is disclosed. With a circuit board and probe plate mounting within a housing having a top and bottom, hinged together, at closure there may be slight misalignments of the two. By making one of the two plates floating, or laterally slideable with respect to each other, it is possible to make final alignment at closure. One of the two plates can be provided with a pin and the other with a pin receiving alignment block. With the lateral sideability, the pin and block can insure proper probe alignment. Additional systems for correcting misaligned pins or blocks are also disclosed.

12 Claims, 12 Drawing Sheets

CIRCUIT BOARD TESTING DEVICE WITH SELF ALIGNING PLATES

CROSS-REFERENCE TO RELATED APPLICATIONS

This application claims the benefit of U.S. Provisional Application No. 60/902,334 filed 20 Feb. 2007, which hereby is incorporated herein by reference in its entirety.

STATEMENT REGARDING FEDERALLY SPONSORED RESEARCH OR DEVELOPMENT

Not Applicable

BACKGROUND OF THE INVENTION

1. Field of the Invention

This invention is directed to test equipment, and more particularly to test equipment for circuit boards.

2. Description of the Related Art

Circuit board testers are used for testing a variety of circuit boards or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency, phase and the like) are applied by the tester, typically under control of a computer, to certain of the probes. Some or all of the probes are used to measure the performance or response of the circuit board (i.e., to measure electrical parameters at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company. Even with the relatively rapid test procedures which can be achieved by circuit testing, it is not unusual for desired testing of each circuit board to require on the order of 30 seconds to 90 seconds or more.

Because, in at least some applications, circuit board testing is performed on substantially all devices on a production line or production facility, speed and reliability of testing can be especially important since delay or failure at a testing station can delay or interrupt the overall production in a production line or facility. Accordingly, it would be useful to provide a fixture, useable in connection with in-circuit testers, which provides desired speed of positioning the circuit board or other unit under test (UUT) and which achieves a relatively high degree of reliability, e.g., so as to avoid interrupting or delaying production rates at a production line or facility.

The effect of such testing on overall production rates is at least partially related to the rate at which each UUT can be placed in the fixture and the rate at which the fixture can accurately and reliably move the UUT to the desired position or positions.

One arrangement is that it has a test bed of probes on a base and a hinged cover carrying the UUT bolted into the upper hinged portion of the test device. This configuration depends upon perfect alignment of the UUT and the test bed. Such perfect alignment is not always achievable and much work is required to realign the UUT and the probe bed for perfect mating. Furthermore, the circuit boards (UUT) themselves vary somewhat from unit to unit making successive tests problematic without realignment.

BRIEF SUMMARY OF THE INVENTION

The present invention relates to a system and method for insuring alignment of a probe plate with a unit under test (UUT) by bringing physical and electrical contacts into reliable and repeatable alignment even where there are expected shifts between the probe plate/array and the UUT.

The following are some of the features of the invention.

There is disclosed a circuit tester for testing circuit boards having a housing having first and second parts hinged together; a first board mounting plate affixed to the first part of said housing; a probe plate attached to the second part of said housing, said plate having at least one probe, at least one of said plates being slideably attached to said housing to permit lateral shifting thereof; at least one aligner between said board mounting plate and said probe plate for bringing said probe plate into desired alignment with said board when said first and second parts are hingedly brought together; said aligner including a bolt attached to one plate and a bolt receiving element attached to the other, and wherein said bolt receiving element includes an aperture larger than the bolt, so that the plates may move relative to each other, and further including a further pin on one plate and fixed alignment receiver which when brought together they align the two plates.

A further feature of the invention is having the pin including a distal end which is chamfered to aid in mating with said aperture in said receiver.

A further feature of the invention is herein said bolt is round and of a predefined diameter and wherein said aperture in bolt receiving element has a diameter larger than said predefined diameter, thereby defining a gap.

A further feature of the invention is wherein said gap is generally equal to the degree of lateral movement of one of said plates.

A further feature of the invention is wherein said bolt has a threaded portion an unthreaded shoulder portion and a head portion.

A further feature of the invention is including at least to aligners, and wherein said aligners are located in different quadrants of the plates.

A further feature of the invention is wherein said aligner further includes:

at least one aperture on said plate which includes said pin, a shoulder bolt of dimension smaller than said aperture.

A further feature of the invention is a circuit tester for testing circuit boards having a housing having first and second parts hinged together; a first circuit board mounting plate affixed to the first part of said housing; a probe plate attached to the second part of said housing, said plate having at least one probe capable of contacting the circuit board; at least one of said plates being mounted to said housing by a plurality of bolts received within receivers of diameter larger than said bolts lateral shifting thereof generally equal to the differential between the bolt diameter and the receiver diameter, at least two alignment elements located on different quadrants of the plates, between said board mounting plate and said probe plate for bringing said probe plate into desired alignment with said circuit board when said first and second parts are hingedly brought together; said aligner including a fixed pin on one plate and fixed alignment receiver, said pin and said receiver being of generally the same size so that when brought together they align the two plates.

A further feature of the invention is wherein the alignment receiver includes an aperture for receiving said pin and further includes a position adjuster capable of adjusting the position of the aperture.

A further feature of the invention is wherein said position adjuster includes a pair of screw adjusters, one for x and y axes.

Another feature of the invention is a method of precisely aligning a circuit board with a probe plate comprising the steps of: mounting the circuit board or probe plate on either side of a hingable housing; providing slideable engagement of either the probe plate or circuit board with respect to its side of the housing; proving an engageable aligner between the plate and circuit board, bringing the two boards together precisely aligning the boards just before the moment of contact.

It is to be understood that this summary is intended only to assist the reader in preparing to understand the invention as described below and is not intended to limit the scope thereof in any way. The scope of protection of the invention is defined by the claims which follow this disclosure.

DETAILED DESCRIPTION OF THE INVENTION

In a manufacturing environment for circuit boards, a final test will often be an electrical test, to ensure that each circuit board performs as required. Such tests are well-known in the industry, and may be performed by commercially available testers, such as Agilent Model 3070.

Figure 1:
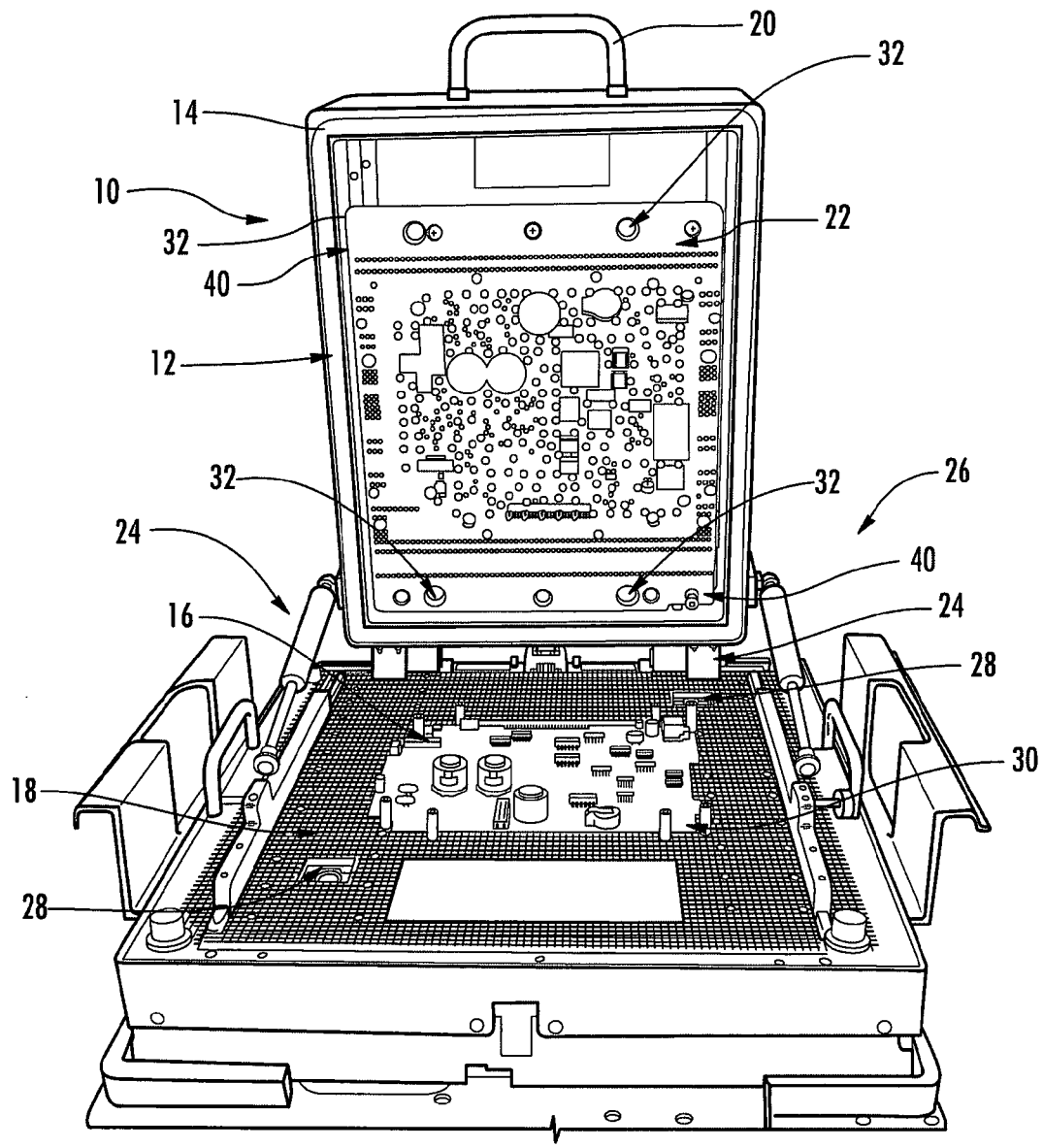
FIG. 1 is a perspective view of a circuit board tester in open position.

A detailed view of the mechanical configuration is shown in FIG. 1. The UUT (unit under test) is shown as a circuit board 16 and is removably and rigidly attached to, and optionally, spaced apart from, a support plate or mounting plate 18 with or without spacer elements. In this configuration, the electrical contacts on the UUT 16 that are to be tested face upward, and are accessible by various probes on plate 18. There may also be probes from underneath the UUT 16. In this case, probes from the top are illustrated. Note that the circuit board and fixture on which it is mounted are considered one for the purpose of this application, though they are likely to be separate components. One of the issues resolved by this invention is relative movement between the board and the probes. We refer to the circuit board whether or not it includes a fixture. The probes may apply and measure voltages or currents at various locations on the UUT, and are controlled mechanically and electrically by the tester. A computer, not shown, may control the tester and may record data from the tests.

The testing system 10 is shown as a box with a top 12 with handle 20 holding a probe plate 22. Probe plate 22 is configured to be freely moveable in lateral directions and optionally to a limited degree along a vertical axis which passes orthogonally thru the UUT 16 and probe plate 22 when the box is closed.

The bottom of the system 10 includes a support plate 18 which supports the UUT 16 preferably rigidly in place on plate 18. There are several ways to accomplish this rigid connection. The preferred way is by posts 30 which surround the UUT and create a rigid perimeter. The posts may engage notches in the UUT board, but they may also simply be placed around the periphery to inhibit movement. In some circumstances, the UUT may have existing apertures which allow it to be affixed to the support plate.

Hinges 24 allow the top 12 and support 18 to move relative to each other. Pneumatic cylinders 24, regulate the movement of the top and plate.

Fundamentally, there is a problem where the probe plate and UUT are not perfectly aligned. This can occur for many reasons, none of which can be fully anticipated. Therefore, a simple way to align the UUT with the probe plate immediately before engagement is highly desirable. Thus a system and method which causes alignment at the last moment before contact is preferable to any other system because earlier alignment my not be sustainable in the remaining travel toward contact. In the present invention, means are provided to allow the plate on which the UUT or the UUT itself to be secured in the housing but to float/shift laterally in response to alignment means and devices which are provided on the plate or UUT. Note that either the UUT, the (circuit) board, or the probe plate can be allowed to float. It is only important that one can float or move laterally to make the alignment possible. These aligners (or alignment blocks in the preferred embodiment) take advantage of the lateral translation capability of the UUT and as the test cover is being closed, make final and precise alignment. Thus, the fasteners which allow the UUT to float may be of many designs, not just the few which are detailed in this disclosure. In the preferred embodiment there will be at least 2 alignment blocks in different quadrants of the plates (the plate having an imaginary division of 4 quadrants). It would be best to put the blocks in diagonally opposite quadrants if only two are used. One can be used but with less precision or if the alignment bold it a bar type structure which will cause alignment along its face so that both x and y axes are aligned simultaneously by one aligner. This is not preferred however because it is difficult to align such a bar.

Figure 6:
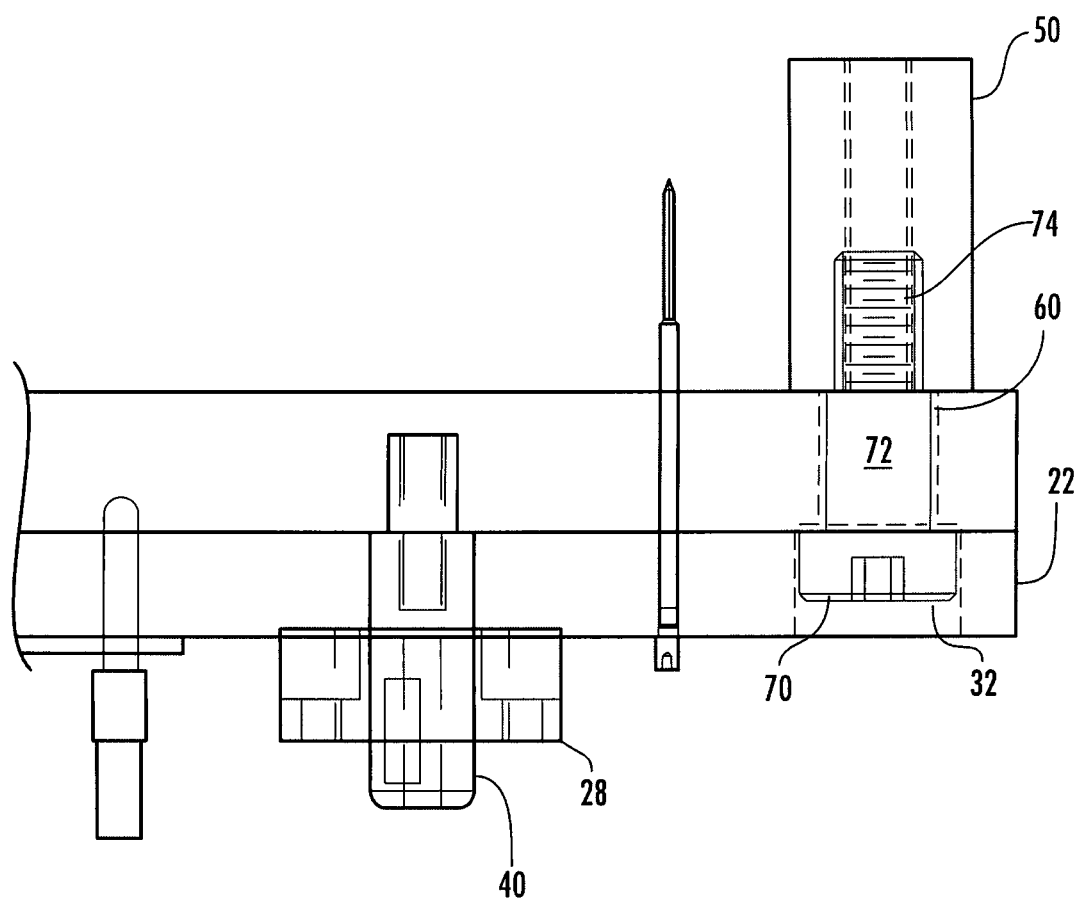
FIG. 6 is side plan view in section, with portions broken away illustrating shoulder bolts, registration pins and registration blocks.

The lateral and vertical adjustability (movement) to the probe plate (or the UUT if reversed) is obtained by several mechanisms. The probe plate is slideably affixed to its housing 14 on shoulder bolts 32. FIG. 6 is side plan view in section, with portions broken away illustrating shoulder bolts, registration pins and registration blocks.

Figure 7:
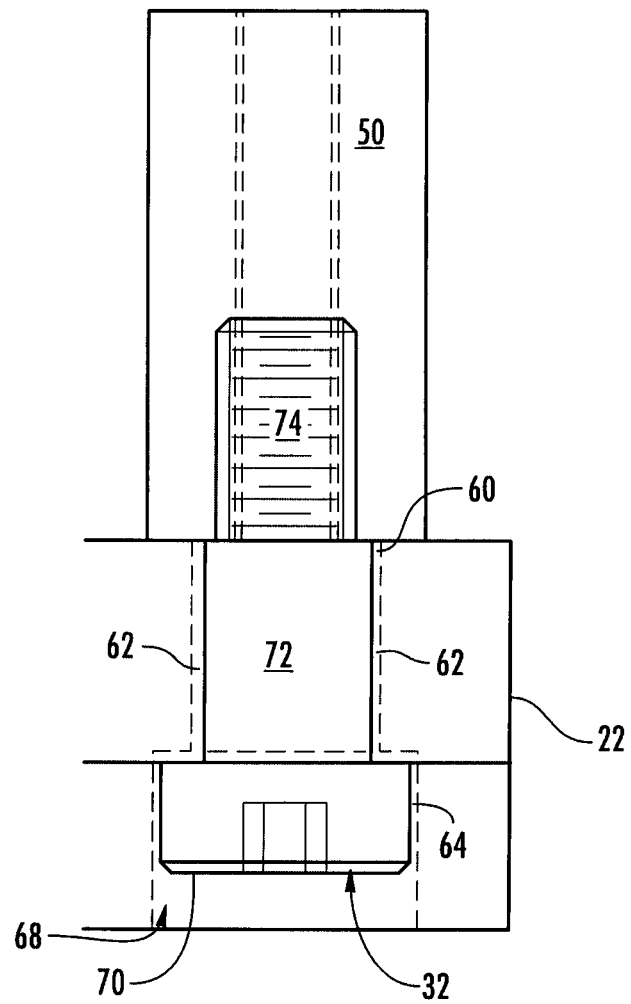
FIG. 7 is a view of a portion of FIG. 6 showing a close up of a shoulder bolt and stand off in place on a probe plate.

FIG. 7 is a view of a portion of FIG. 6 showing a close up of a shoulder bolt and stand off in place on a probe plate. This allows the probe plate to move laterally to align its alignment pins 40 on alignment blocks 28 (i.e., aligners or alignment means). In this embodiment there are two such blocks. There can be any number greater than two in the preferred configuration. Shoulder bolts, or bolts, are just one kind of fastener which will allow lateral play while limiting vertical movement (if desired, as is the case here). They need not be cylindrical or "bolts" in the common meaning of the term, but only provide a guide attached to one (either) of the plates. The key is to create play or float in the gap between the bolt's outside dimension and the receiving blocks's bore in which it is received during the alignment phase.

Figure 2:
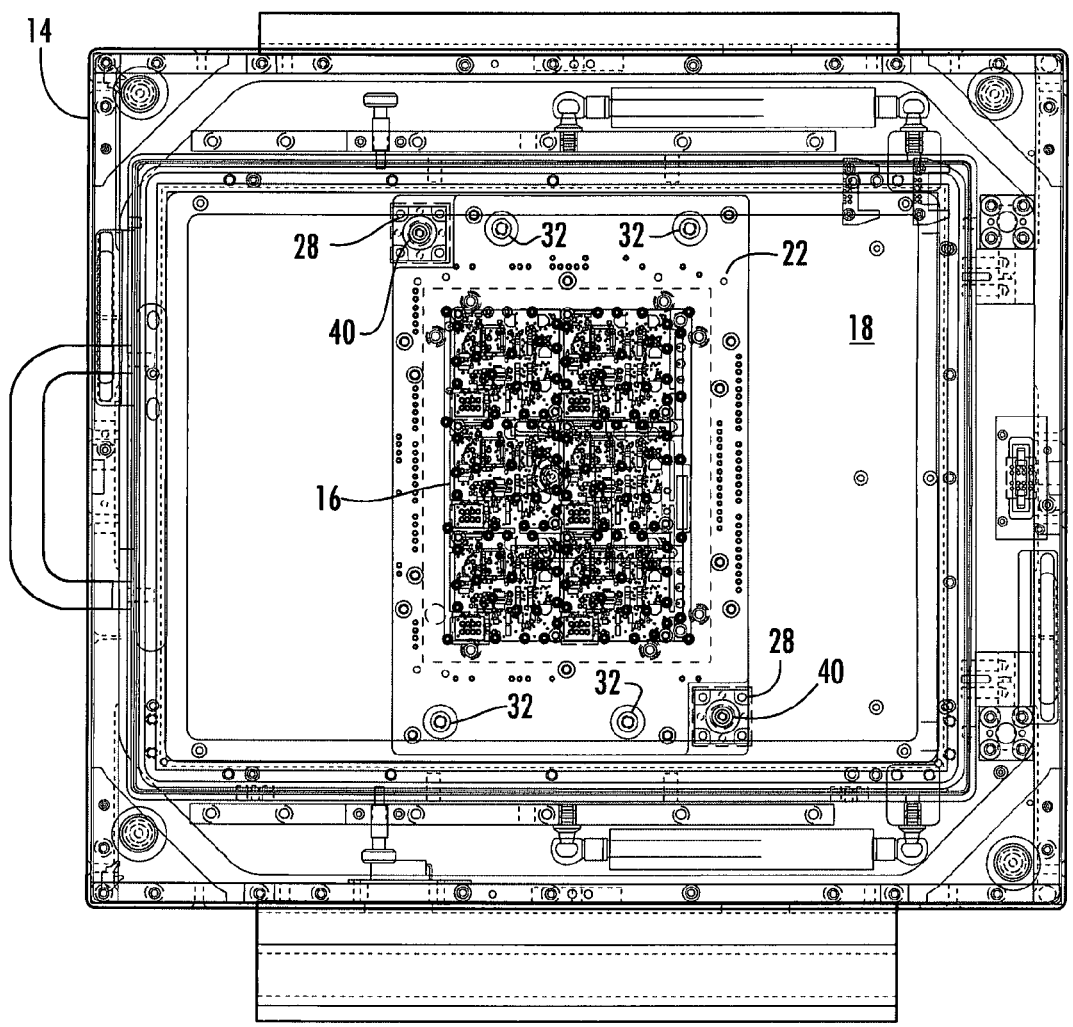
FIG. 2 illustrates a schematic view of a circuit board tester in test position looking downwardly from the top, with portions broken away.
Figure 3:
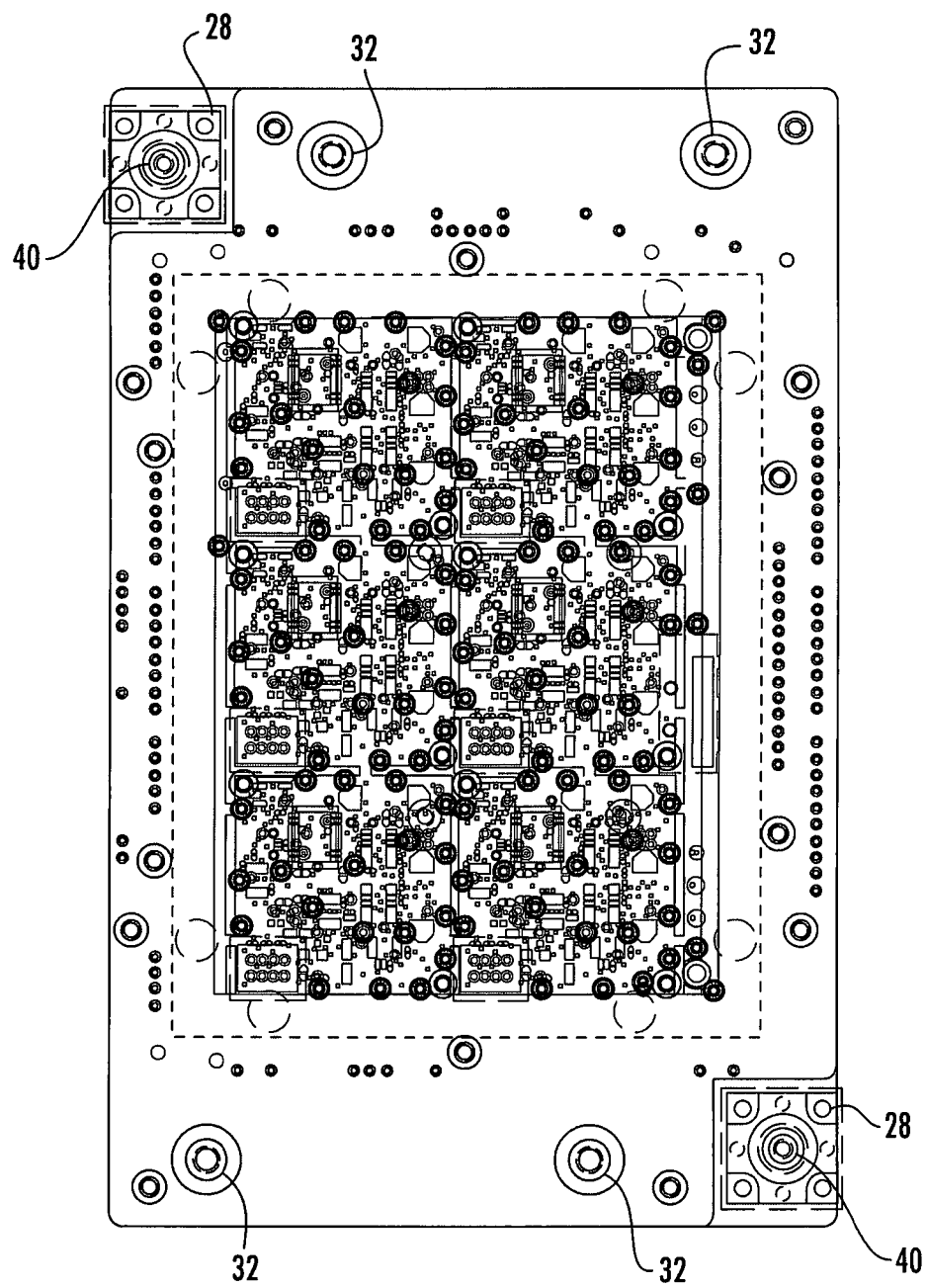
FIG. 3 illustrates a schematic view looking at the probe plate, UUT, and support plates from the top down.
Figure 4:
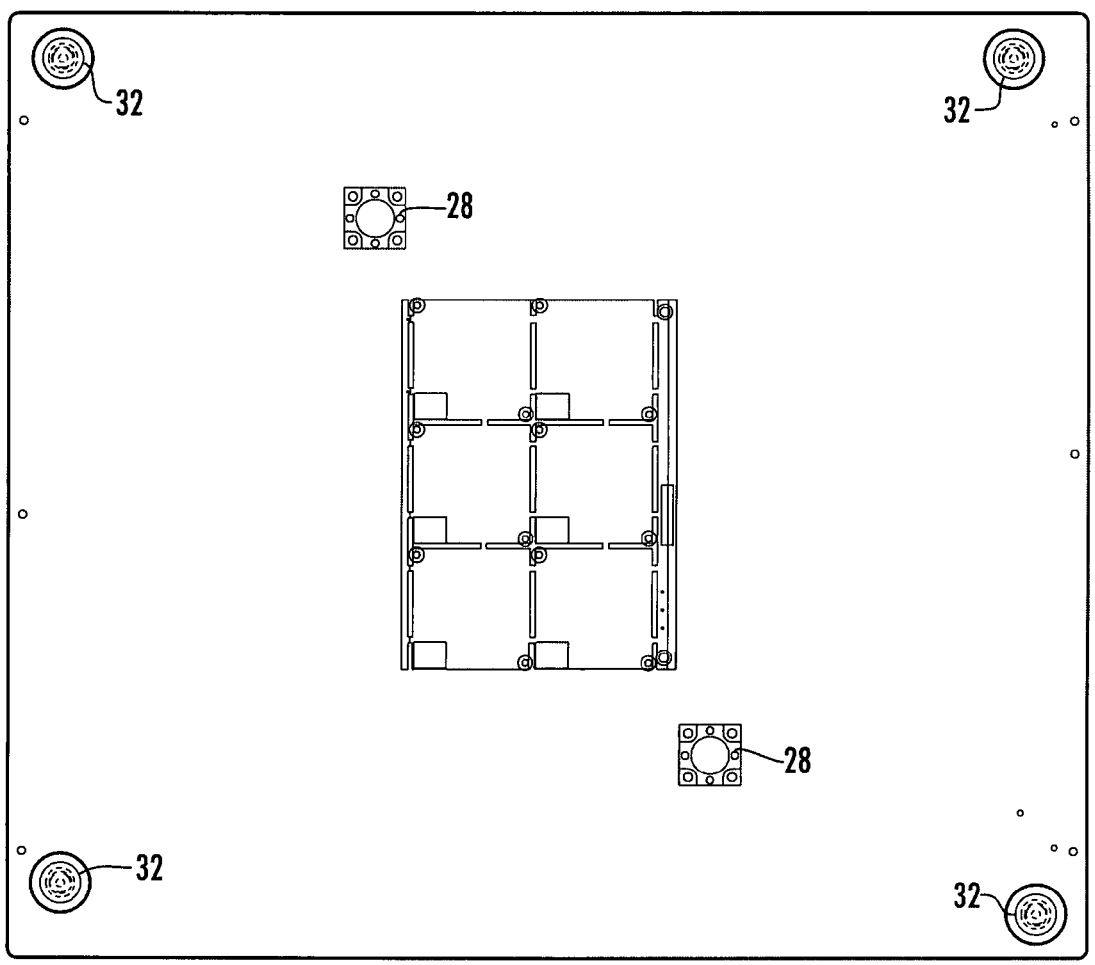
FIG. 4 is a schematic view of the support plate and UUT with the probe plate removed, from top down.
Figure 5:
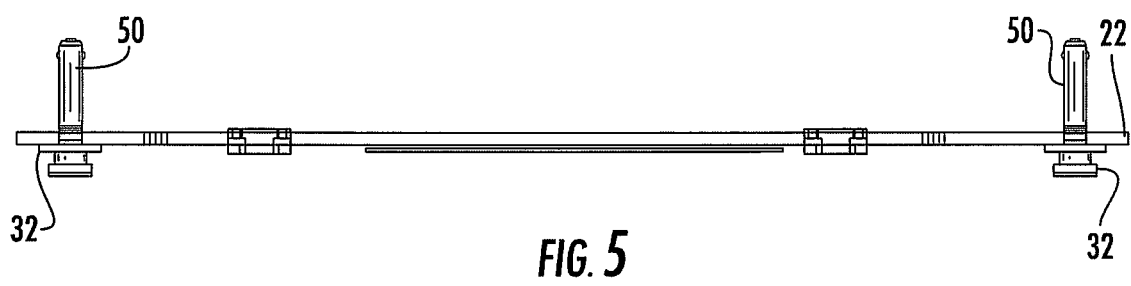
FIG. 5 is a schematic of a side view of a probe plate and associated hardware with registration blocks of the bottom support plate shown.

FIG. 2 illustrates a top view of the system in test position and FIG. 3 illustrates the system in test position with the top housing 14 overlying the base and support plate 18 with the UUT 16 sandwiched between the probe plate 22 and support plate 18. Four shoulder bolts 32 are shown. Alignment bolts 40 are shown engaged in alignment blocks 28. FIGS. 4 and 5 are similar views of these objects. FIG. 3 illustrates a schematic view looking at the probe plate, UUT, and support plates from the top down, and FIG. 4 is a schematic view of the support plate and UUT with the probe plate removed, from top down.

FIG. 5 is a side view of the probe plate 22 with shoulder bolts 32 in place. Bolts 32 are preferably threaded into standoffs which hold the probe plate spaced from the housing 14. They are preferably rigidly affixed to the house by additional fasteners (not shown). The standoff will be of whatever length is required to insure proper mating of the housing and probe plate with the underlying UUT.

FIGS. 6, and 7 illustrate the feature and functions of the shoulder bolts 32. Each shoulder bolt includes a head 70, a shoulder portion 72 and a threaded portion 74 which is threaded into the standoff. The probe plate includes apertures 60 which has a slightly greater diameter (or cross section if not round) than shoulder portion 72. This gap 62 provides the lateral movement of the probe plate relative to the housing 14 and the UUT 16. Note that lesser of gap 62 or 64 (surrounding the head 70) will control the lateral movement. Since the shaft of the bolt is longer than the head, gap 62 which surrounds the shaft is typically the one which is used to control the float. Thus gap 64 is necessarily larger, but the reverse could also be employed. It is also advisable that the head 70 be recessed by counterboring 68 to prevent the head from inhibiting lateral movement.

With the probe plate capable of lateral movement (i.e., movement parallel to the UUT when in test position and orthogonal to bolts 32), it is the mating of alignment bolt or pins 40 into alignment blocks 28 which control the precise alignment of the probe plate and UUT.

Figure 8:
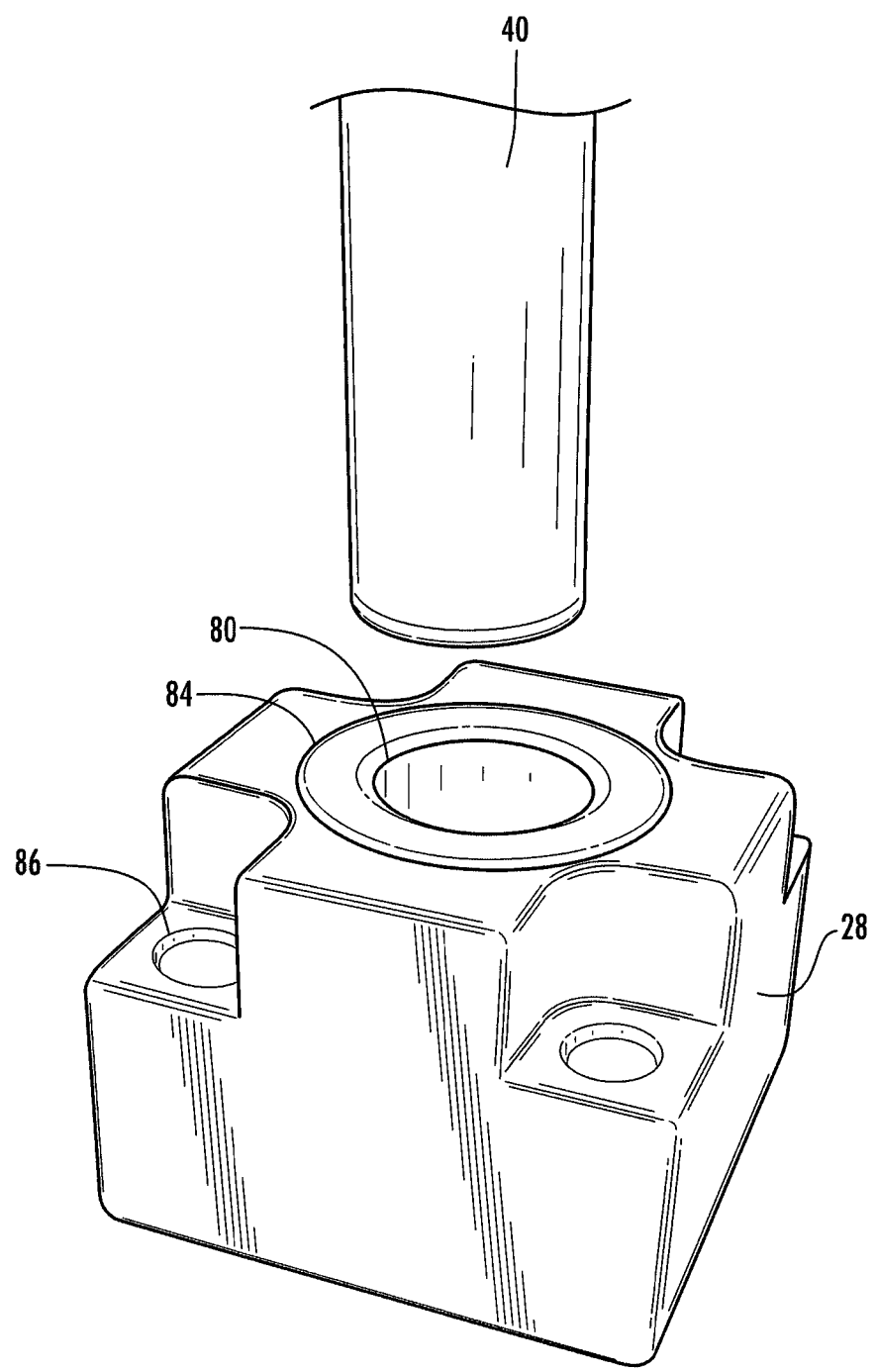
FIG. 8 is a top perspective of a registration bolt and block approaching engagement.
Figure 9:
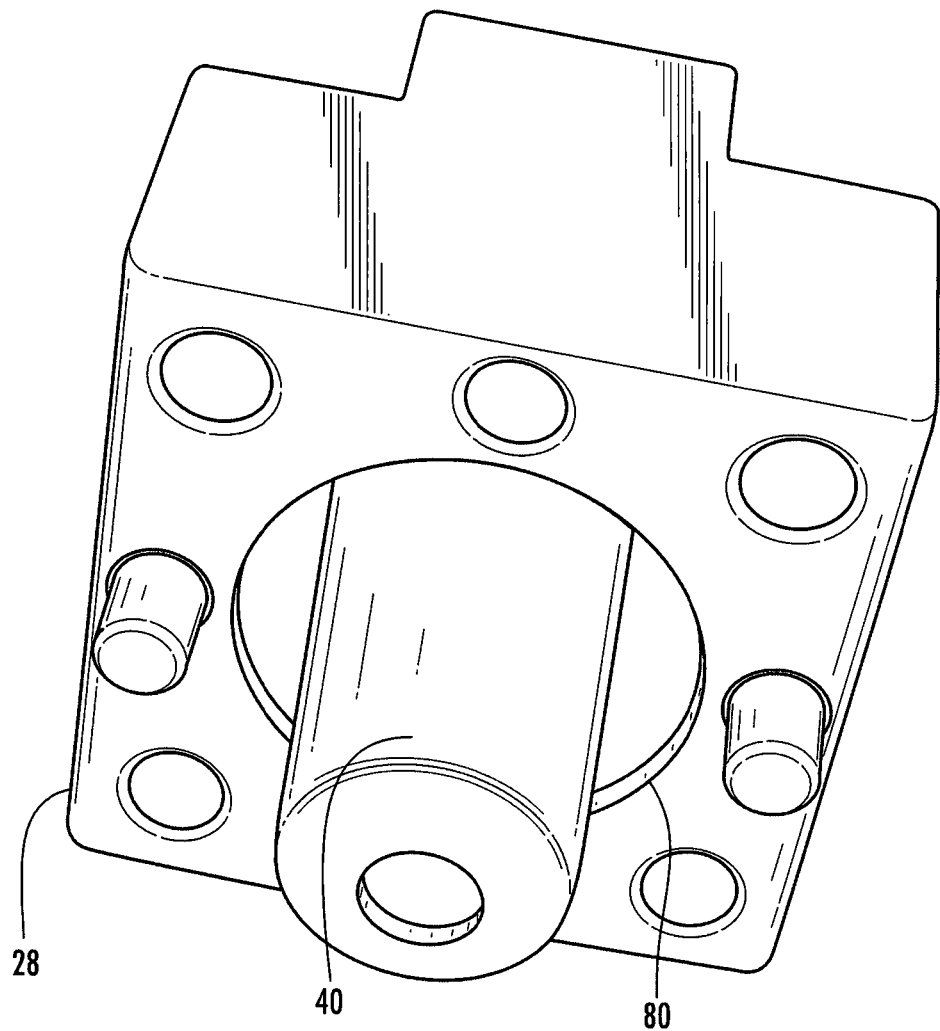
FIG. 9 is a bottom perspective view of a registration bolt and block engaged.
Figure 10:
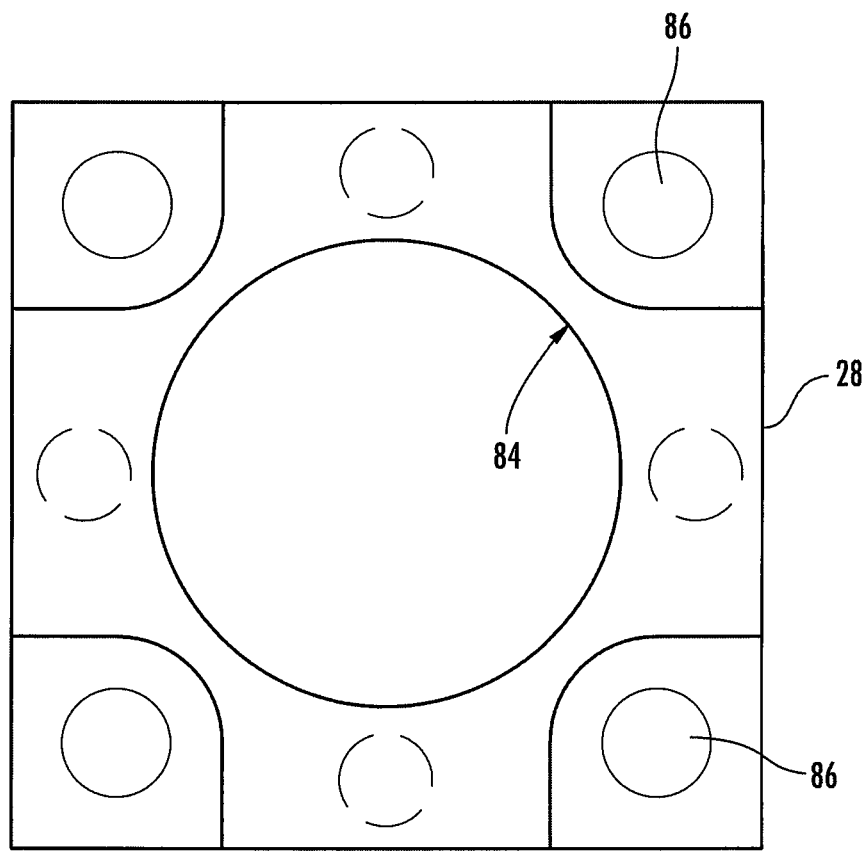
FIG. 10 is a top plan schematic view of a registration block.

FIGS. 8, 9 and 10 illustrate this mating. The alignment bolt or pin is precisely secured to the probe plate and the block 28 is likewise precisely secured to the support plate. The engagement end 80 of the pin 40 is preferably chamfered or rounded at its distal end to aid in engagement. Likewise the alignment block 28 includes a preferably hardened bushing 84 with a central aperture, which may also be rounded/chamfered at its receiving end of more easily mate with pin 40 when they are misaligned, as they are expected to be. The block preferably has mounting apertures 86 with cut away portions to recess fasteners. On the bottom side (FIG. 9) are preferably pins 88 which mate with recesses in the support plate to further insure precise alignment. Chamfering or rounding may be important because of the geometry of hinges. They path of the housing as it closes, follows and arc so that it is the pin and receiver with not be arriving co-linearly aligned, but askew. The chamfering prevents the elements from colliding in such a way as to freeze the movement of either.

It will be appreciated that errors can occur in the placement of the pins 40 or block 28, or for other reasons, alignment is not perfect. To avoid having to rebuild the tester altogether, it is possible to modify alignment blocks 28 so that their bushings 84 compensate for slight errors. This is accomplished by drilling the mounting hole for the bushing off center, or by drilling the central aperture in the bushing off center. Thus a method of manufacture and/or use of this invention includes the step of alignment of the pin and block by alteration of the block to accommodate precise alignment.

Figure 11:
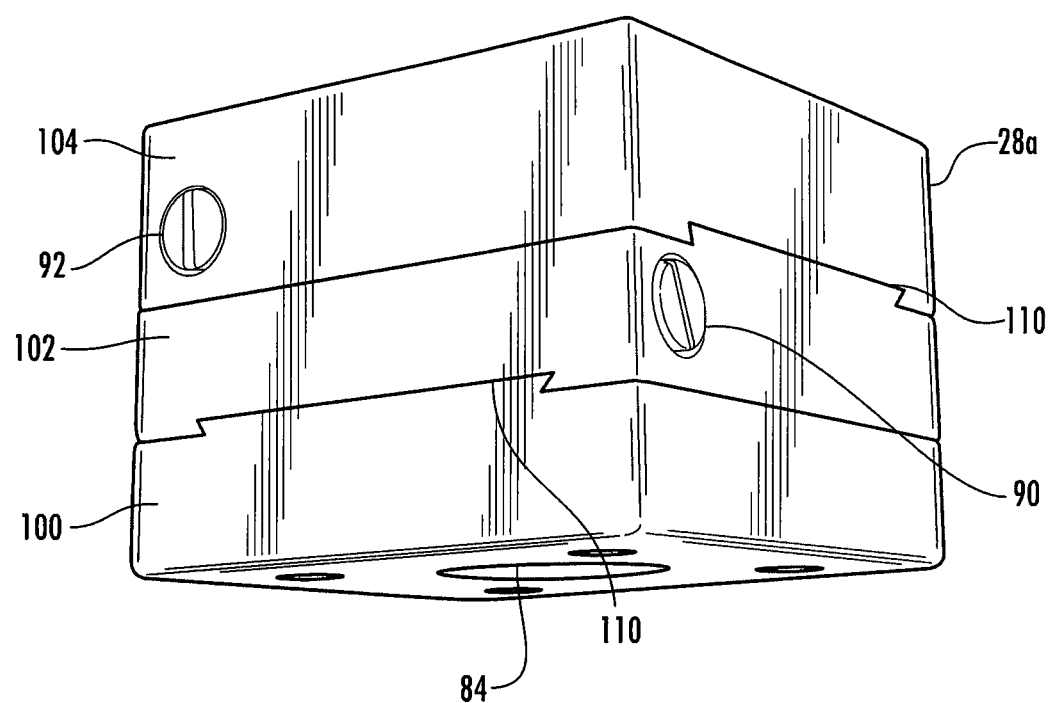
FIG. 11 is a side perspective view of an adjustable registration block.
Figure 12:
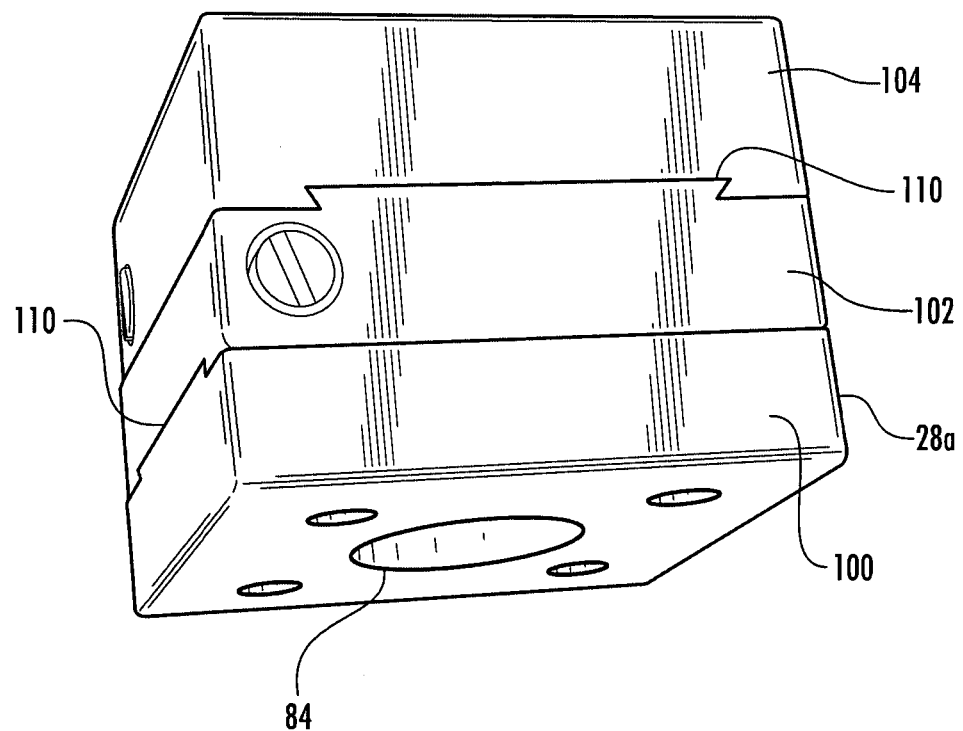
FIG. 12 is another side perspective view of the block in FIG. 11 showing adjustment screws and a portion of the bottom.

FIGS. 11 and 12 illustrate another of many ways to compensate for alignment errors. Block 28*a* is similar to block 28 in its function except that it includes adjusters 90, 92 which cause the block stock 100, 102, 104 to slide relative to each other. The blocks 100, 102, 104 are slideably interlocked to their adjacent block by dovetail interlocking grooves or cuts which are capable of sliding past each other. The sliding action for each pair of blocks is controlled by set screws 90 and 92 which drive nuts (not shown) inside the blocks which are attached to the blocks and cause lateral movement in X or Y axis (depending on the screw). In effect, the blocks include a rack and pinion style drive which allow bushing 84 to be shifted in any of four directions or combinations thereof. Other structures which allow for the central axis of the bushing to be moved, will accomplish this inventive concept of allowing for precision adjustment. This concept, i.e. having the alignment blocks themselves be alignable may be used together with the other concepts of this disclosure or singly. Furthermore, this concept is not limited to the rack and pinion solution shown, but any solution which would allow adjustment of the position of the aperture 84 relative the surface upon which it is mounted. For example, another solution would be to drill hole 84 off center (though not adjustable). A further solution would be to provide apertures 86 (FIG. 10) to be elongated or to be screw adjustable, to allow shifting of the position of the block.

It will be appreciated that while the preferred embodiment is to adjust the probe plate relative to a fixed UUT, the opposite arrangement is likewise possible with lateral movement being permitted in the UUT circuit board or both, by providing means such as shoulder bolts to both. The alignment blocks may recessed as shown in FIG. 3 to allow greater clearance for probes and testers or the blocks may be installed on the top unit or probe plate itself. Furthermore, it is possible to have double alignment from above and below the UUT. If the UUT is likewise mounted on a lateral shifting mechanism, such as the shoulder bolts shown, then a probe plate from above can also be located below and the UUT can be tested on both sides simultaneously with precision alignment of both sides being possible.

The forgoing disclosure is not intended to be a limit to the scope of the invention. The claims define the scope and should be interpreted broadly.

The invention claimed is:

1. A circuit tester for testing for testing circuit boards comprising:
   a housing having first and second parts hinged together;
   a first board mounting plate affixed to the first part of said housing;
   a probe plate attached to the second part of said housing, said plate having at least one probe
   at least one of said plates being slideably attached to said housing to permit lateral shifting thereof within a predetermined range of lateral movement by at least one shoulder bolt received within at least one hole in one of the plates, said hole having a diameter larger than said shoulder bolt to loosely secure the plate while allowing lateral shifting thereof in an amount generally equal to a differential between a shoulder bolt diameter and the hole diameter, thereby defining a predetermined range of lateral movement;
   at least one aligner between said board mounting plate and said probe plate for bringing said probe plate into desired alignment with said board when said first and second parts are hingedly brought together, so that the plates may move relative to each other.

2. The tester of claim 1 further including a pin on one plate and fixed alignment receiver which when brought together they align the two plates and wherein the pin includes a distal end which is chamfered to aid in mating with said aperture in said receiver.

3. The tester of claim 2 wherein said bolt is round and of a predefined diameter and wherein said aperture in bolt receiving element has a diameter larger than said predefined diameter, thereby defining a gap.

4. The tester of claim 1 wherein said gap is generally equal to the degree of lateral movement of one of said plates.

5. The tester of claim 1 wherein said aligner including a bolt attached to one plate and a bolt receiving element attached to the other, and wherein said bolt receiving element includes an aperture larger than the bolt and wherein said bolt has a threaded portion an unthreaded shoulder portion and a head portion.

6. The tester of claim 1 including at least to aligners, and wherein said aligners are located in different quadrants of the plates.

7. The tester of claim 1 wherein said aligner further includes:
   at least one aperture on said plate which includes said pin, a shoulder bolt of dimension smaller than said aperture.

8. A circuit tester for testing for testing circuit boards comprising:
   a housing having first and second parts hinged together;
   a first circuit board mounting plate affixed to the first part of said housing;
   a probe plate attached to the second part of said housing, said plate having at least one probe capable of contacting the circuit board;
   at least one of said plates being mounted to said housing by a plurality of bolts received within receivers within a predetermined range of lateral movement by at least one bolt received within a hole in one of the plates of diameter larger than said bolt to loosely secure the plate while allowing lateral shifting thereof in an amount generally equal to a differential between a bolt diameter and the hole diameter thereby defining a predetermined range of lateral movement;
   at least two alignment elements located on different quadrants of the plates, between said board mounting plate and said probe plate for bringing said probe plate into desired alignment with said circuit board when said first and second parts are hingedly brought together.

9. The tester of claim 8 wherein said aligner including a fixed pin on one plate and fixed alignment receiver, said pin and said receiver being of generally the same size so that which when brought together they align the two plates and the alignment receiver includes an aperture for receiving said pin and further includes a position adjuster capable of adjusting the position of the aperture and wherein said aligner is configured such that said plates are brought into alignment before said probe make contact.

10. The tester of claim 9 wherein said receiver includes a plurality of stacked plates and a pair of screw adjusters, one for x and y axes.

11. A method of precisely aligning a circuit board with a probe plate comprising the steps of:
   mounting a circuit board or probe plate on either side of a hingable housing;
   providing slidable engagement of either the probe plate or circuit board with respect to its side of the housing;
   providing an aperture in the circuit board for receiving a shoulder bolt having a predetermined diameter, to retain the circuit board or probe plate on one side of the hingable housing; said aperture having a diameter greater than said shoulder bolt diameter thereby allowing limited lateral shifting thereof in an amount generally equal to a differential between a shoulder bolt diameter and the greater hole diameter to create predefined range of lateral movement between the probe plate or the circuit board by slidable engagement of either the probe plate or circuit board with respect to its side of the housing;
   locating an aligner between the plate an circuit board,
   bringing the two boards together, precisely aligning the boards before the moment of contact.

12. The tester of claim 9 wherein the receiver includes a plurality of stacked plates and two adjusters, one on each plate and provided with adjusters for x and y positions respectively, and wherein the plates slide relative to each other by interlocking dovetail grooves in the plates.

* * * * *